(12) United States Patent
Wei et al.

(10) Patent No.: US 8,390,127 B2
(45) Date of Patent: Mar. 5, 2013

(54) CONTACT TRENCHES FOR ENHANCING STRESS TRANSFER IN CLOSELY SPACED TRANSISTORS

(75) Inventors: Andy Wei, Dresden (DE); Jan Hoentschel, Dresden (DE); Heike Salz, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 141 days.

(21) Appl. No.: 12/469,972

(22) Filed: May 21, 2009

(65) Prior Publication Data

US 2009/0321837 A1 Dec. 31, 2009

(30) Foreign Application Priority Data

Jun. 30, 2008 (DE) .......................... 10 2008 030 852

(51) Int. Cl.
*H01L 23/48* (2006.01)
(52) U.S. Cl. ........................................ 257/774; 257/775
(58) Field of Classification Search .................. 257/775, 257/774
See application file for complete search history.

(56) References Cited

U.S. PATENT DOCUMENTS

| 7,719,062 B2* | 5/2010 | Fischer et al. ................. 257/382 |
| 2005/0260806 A1* | 11/2005 | Chang et al. .................. 438/197 |
| 2006/0113568 A1* | 6/2006 | Chan et al. .................... 257/204 |
| 2006/0131662 A1* | 6/2006 | Yamada et al. ............... 257/374 |
| 2007/0132032 A1 | 6/2007 | Teo et al. ....................... 257/369 |
| 2008/0023772 A1 | 1/2008 | Kawakita ....................... 257/369 |
| 2008/0048271 A1* | 2/2008 | Yang et al. .................... 257/369 |
| 2008/0157208 A1 | 7/2008 | Fischer et al. ................. 257/368 |

FOREIGN PATENT DOCUMENTS

| JP | 2007-005578 | 1/2007 |
| WO | WO 2008/027471 A1 | 3/2008 |

OTHER PUBLICATIONS

PCT Search Report and Written Opinion from PCT/US2009/003876 dated Sep. 1, 2009.
Translation of Official Communication from German Patent Office for German Patent Application No. 10 2008 030 852.8-33 dated May 27, 2009.

* cited by examiner

*Primary Examiner* — N Drew Richards
*Assistant Examiner* — Yu-Hsi D Sun
(74) *Attorney, Agent, or Firm* — Williams, Morgan & Amerson, P.C.

(57) ABSTRACT

Scalability of a strain-inducing mechanism on the basis of a stressed dielectric overlayer may be enhanced by forming a single stress-inducing layer in combination with contact trenches, which may shield a significant amount of a non-desired stress component in the complementary transistor, while also providing a strain component in the transistor width direction when the contact material may be provided with a desired internal stress level.

22 Claims, 6 Drawing Sheets

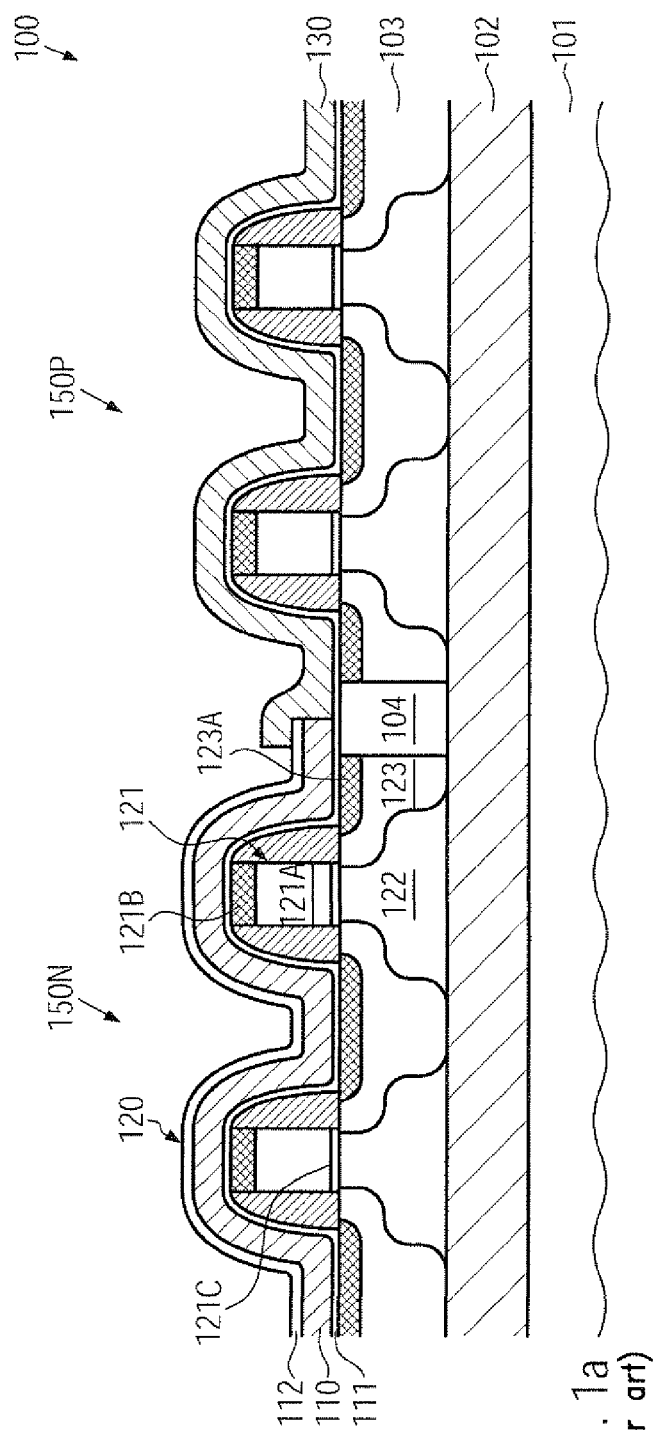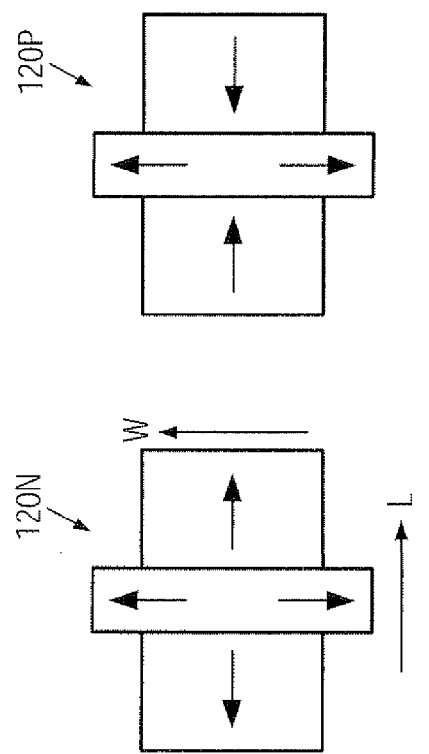
FIG. 1a (prior art)
FIG. 1b (prior art)

CONTACT TRENCHES FOR ENHANCING STRESS TRANSFER IN CLOSELY SPACED TRANSISTORS

BACKGROUND OF THE INVENTION

1. Field of the Invention

Generally, the present disclosure relates to the field of integrated circuits, and, more particularly, to field effect transistors and manufacturing techniques on the basis of stressed dielectric layers formed above the transistors used for generating a different type of strain in channel regions of different transistor types.

2. Description of the Related Art

Integrated circuits are typically comprised of a large number of circuit elements located on a given chip area according to a specified circuit layout, wherein, in complex circuits, the field effect transistor represents one predominant circuit element. Generally, a plurality of process technologies for advanced semiconductor devices are currently practiced, wherein, for complex circuitry based on field effect transistors, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of MOS transistors. Thus, the reduction of the channel length, and associated therewith the reduction of the channel resistivity, may be a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One issue associated with reduced gate lengths is the occurrence of so-called short channel effects, which may result in a reduced controllability of the channel conductivity. Short channel effects may be countered by certain design techniques, some of which, however, may be accompanied by a reduction of the channel conductivity, thereby partially offsetting the advantages obtained by the reduction of critical dimensions.

In view of this situation, it has been proposed to enhance device performance of the transistor elements not only by reducing the transistor dimensions but also by increasing the charge carrier mobility in the channel region for a given channel length, thereby increasing the drive current capability and thus transistor performance. For example, the lattice structure in the channel region may be modified, for instance, by creating tensile or compressive strain therein, which results in a modified mobility for electrons and holes, respectively. For example, creating tensile strain in the channel region of a silicon layer having a standard crystallographic configuration may increase the mobility of electrons, which in turn may directly translate into a corresponding increase of the conductivity of N-type transistors. On the other hand, compressive strain in the channel region may increase the mobility of holes, thereby providing the potential for enhancing the performance of P-type transistors.

One efficient approach in this respect is a technique that enables the creation of desired stress conditions within the channel region of different transistor elements by adjusting the stress characteristics of a dielectric layer stack that is formed above the basic transistor structure. The dielectric layer stack typically comprises one or more dielectric layers which may be located close to the transistor and which may also be used in controlling a respective etch process in order to form contact openings to the gate and drain and source terminals. Therefore, an effective control of mechanical stress in the channel regions, i.e., effective stress engineering, may be accomplished by individually adjusting the internal stress of these layers, which may also be referred to as contact etch stop layers, and by positioning a contact etch stop layer having an internal compressive stress above a P-channel transistor while positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be used due to its high etch selectivity with respect to silicon dioxide, which is a well-established interlayer dielectric material. Furthermore, PECVD silicon nitride may be deposited with a high intrinsic stress, for example, up to 3 Giga Pascal (GPa) or higher of compressive stress and up to 2 GPa and higher of tensile stress, wherein the type and the magnitude of the intrinsic stress may be efficiently adjusted by selecting appropriate deposition parameters. For example, ion bombardment, deposition pressure, substrate temperature, gas flow rates and the like represent respective parameters that may be used for obtaining the desired intrinsic stress.

During the formation of the two types of stressed layers, conventional techniques may suffer from reduced efficiency when device dimensions are increasingly scaled by using the 45 nm technology and even further advanced approaches, due to the limited conformal deposition capabilities of the deposition processes involved, which may result in respective process non-uniformities during subsequent process steps for patterning the stressed layer and forming contact openings, unless the thickness of the stress-inducing layers is significantly reduced, as will be explained in more detail with reference to FIGS. 1a-1d.

FIG. 1a schematically illustrates a cross-sectional view of a semiconductor device 100 in an advanced manufacturing stage. As illustrated, the semiconductor device 100 may comprise a substrate 101, which may represent any appropriate carrier material for forming thereabove circuit elements, such as transistors, capacitors and the like. In the example shown, the substrate 101 may comprise a buried insulating layer 102, such as a silicon dioxide layer, on which is formed a semiconductor layer 103, such as a silicon-based layer, which may also include other components such as germanium, carbon and the like. An isolation structure 104, for instance comprised of silicon dioxide, silicon nitride and the like, may be provided within the semiconductor layer 103, thereby defining a first device region 150N and a second device region 150P. The device regions 150N, 150P may comprise a plurality of transistor elements 120, which may have a lateral distance according to the design rules of the technology under consideration. The transistors 120 provided in the first and second device regions 150N, 150P may comprise gate electrode structures 121 including a gate electrode material 121A, frequently comprised of polysilicon, in combination with a metal silicide 121B for enhancing the overall conductivity of the gate electrode structure 121. Moreover, the structure 121 may comprise a gate insulation layer 121C, which separates the gate electrode material 121A from a channel region 122, which in turn is laterally enclosed by drain and source regions 123. Moreover, metal silicide regions 123A may also be formed in the drain and source regions 123, depending on the overall device requirements. It should be appreciated that the transistors 120 are illustrated so as to have substantially the same configuration in the first and second device regions 150N, 150P, wherein, however, the transistors 120 may at least differ in their conductivity type. That is, in the region 150N, a plurality of N-channel transistors 120 may be provided in which the drain and source regions 123 may be heavily N-doped, while, in the device region 150P, P-channel transistors may be provided in which the corresponding drain and source regions 123 may be P-doped. Consequently, as explained above, performance of the transistors 120 in the device region 150N may be enhanced by providing a tensile strain along the channel length direction, i.e., in FIG. 1a the horizontal direction, thereby enhancing electron mobility in the channel region 122. On the other hand, performance of the transistors 120 in the device region 150P may be enhanced by inducing a compressive strain in the channel regions 122 along the channel length direction, as previously explained, in order to enhance hole mobility. For this purpose, a dual stressed liner approach may be used in which a dielectric layer 110 may be formed above the transistors 120 in the device region 150N, which may exhibit a high internal tensile stress level. Similarly, in the device region 150P, a dielectric material 130 may be formed above the transistors 120, which may exhibit a high internal compressive stress level. Moreover, an etch stop layer 111 may be formed at least below the tensile stressed dielectric material 110 and possibly below the compressively stressed dielectric material 130, for instance in the form of a silicon dioxide material and the like. Moreover, a further etch stop layer or etch indicator layer 112 may be formed on the tensile stressed dielectric material 110.

The semiconductor device 100 as illustrated in FIG. 1a may be formed on the basis of well-established conventional process techniques. That is, after providing the basic transistor structures 120, which may involve manufacturing techniques for forming the isolation structures 104, followed by the patterning of the gate electrode structures 121 and the subsequent formation of the drain and source regions 123, typically on the basis of a sidewall spacer structure of the gate electrode structure 121, with subsequent anneal cycles to activate the dopant species and cure implantation-induced lattice damage. Thereafter, the metal silicide regions 123A, 121B may be formed, for instance on the basis of a common silicidation sequence, as is well known in the art. Next, the etch stop layer 111 may be deposited, for instance by PECVD or thermally activated chemical vapor deposition (CVD), depending on the overall process strategy. The etch stop layer 111 may be provided with a sufficient thickness in order to reliably stop an etch process in a later manufacturing stage when an unwanted material of the tensile stressed dielectric material 110 is to be removed from above the device region 150P. Consequently, for a given material composition of the etch stop layer 111, a specific minimum thickness may have to be applied, for instance in the range of 10-30 or more nm, in order to provide the desired etch stop capabilities. Thereafter, in the example shown, the tensile stressed dielectric material 110 may be deposited on the basis of PECVD techniques, in which deposition parameters may be appropriately adjusted so as to deposit a silicon nitride material with a high internal tensile stress level, as is also previously explained. For this purpose, appropriate deposition parameters, such as the degree of ion bombardment during the deposition, the pressure, the substrate temperature, the gas flow rates and the like, may be appropriately adjusted in order to obtain the desired stress level. As previously explained, in sophisticated semiconductor devices, the lateral distance between neighboring gate electrode structures 121 may require a specific adaptation of the thickness of the layer 110 in order to avoid deposition-related irregularities, such as voids, and provide an appropriate surface topography for subsequent process steps, for instance for forming the compressively stressed dielectric material 130 and removing an unwanted portion thereof. On the other hand, the strain level obtained in the channel regions 122 may be substantially determined by the internal stress level of the dielectric materials 110, 130, the amount of stressed dielectric material positioned closely to the channel regions 122 and the presence of any intermediate substantially non-stressed materials, such as the etch stop layer 111. Consequently, the selected thickness for the dielectric material 110 may represent a compromise between an increased amount of highly stressed dielectric material and the suppression of any process non-uniformities.

After the deposition of the tensile stress layer 110, the etch stop or etch indicator layer 112 may be formed, for instance by deposition of silicon dioxide material and the like, wherein a certain layer thickness for a given material composition may have to be used in order to obtain the required etch stop capabilities during a subsequent etch process. For example, the layer 112 may be provided with a thickness of 10 to several tenths of nm, depending on the overall process strategy. Thus, the deposition of the layers 111, 110 and 112 may have to be carried out such that the finally obtained surface topography may still be appropriate for the subsequent deposition and patterning of the dielectric material 130. After the deposition of the etch stop or indicator layer 112, a mask layer, such as a resist layer, may be formed on the basis of sophisticated lithography techniques in order to mask the device region 150N, while exposing the region 150P to an appropriately designed etch ambient in order to remove the exposed portion of the layer 112, followed by the removal of the layer 110, wherein the etch stop layer 111 may be used as a reliable etch stop material. Thereafter, the resist mask may be removed and the compressively stressed dielectric material 130 may be deposited on the basis of well-established PECVD techniques, wherein, in this case, the deposition parameters may be selected such that the desired high compressive stress level may be obtained. Also in this case, respective process parameters, in particular the degree of ion bombardment during the deposition, may be appropriately adjusted. Thereafter, a further lithography process may be performed to add a resist mask for covering the device region 150P while exposing the region 150N. Next, a further etch process may be performed in order to remove the exposed portion of the material 130 while using the layer 112 as an etch stop material. Thereafter, the resist mask may be removed and the further processing may be continued, for instance, by depositing an interlayer dielectric material, such as silicon dioxide, by using well-established process techniques, such as sub-atmospheric CVD (SACVD), high density plasma assisted CVD and the like. Thereafter, the resulting surface topography may be planarized and contact openings may be formed in the interlayer dielectric material wherein the dielectric materials 110 and 130 may act as etch stop layers, which may subsequently be opened on the basis of respective well-established process techniques. Next, the contact openings may be filled with an appropriate material, such as tungsten and the like, in order to provide electrical contact to the drain and source regions 123 and the gate electrode structures 121.

Consequently, on the basis of the highly stressed dielectric materials 110, 130, the tensile stress level and the compressive stress level, respectively, may provide respective strain components in the channel regions 122, thereby enhancing overall performance of the transistors in the regions 150N, 150P. A corresponding process sequence for forming the differently stressed dielectric materials 110, 130 may be referred to as a dual stress liner approach, which, however, may suffer from a reduced efficiency, in particular when device dimensions of the transistors 120 may further be scaled, as will be described later on in more detail.

FIG. 1b schematically illustrates a top view of one of the transistors 120 of the region 150N and the region 150P in order to demonstrate the effect of various strain components in view of the overall transistor performance. As illustrated, in an N-channel transistor, indicated as 120N, a tension along the transistor length direction, as indicated by the arrow L, may provide enhanced electron mobility. Similarly, a tension along the transistor width direction, indicated by arrow W, may also contribute to enhanced transistor performance. On the other hand, in a P-channel transistor, indicated as 120P, a compressive strain along the transistor length direction may result in enhanced hole mobility, while a tension along the transistor width direction may also be advantageous with respect to enhanced hole mobility. Consequently, due to the mechanism as described with reference to FIG. 1b, the dielectric material 110 having the internal tensile stress level may provide a substantially unidirectional tensile strain along the length direction, while, on the other hand, the highly compressively stressed dielectric material 130 may provide a substantially unidirectional compressive strain component along the transistor length direction. However, the corresponding strain-inducing mechanism may significantly depend on the overall device dimensions, as will be explained with reference to FIGS. 1c-1d.

FIG. 1c schematically illustrates a cross-sectional view of a portion of the semiconductor device 100, for instance the device region 150N may be illustrated. In the example shown, it may be assumed that a distance 124 between the neighboring transistors 120, i.e., the respective gate electrode structures 121, may be approximately 200 nm and significantly greater, wherein also the gate length may be 50 nm and greater. In this case, a thickness 110T of the dielectric material 110 may be appropriately selected to provide the desired surface topography while also respecting the gap filling capabilities of the corresponding deposition technique, as previously explained. On the other hand, a thickness 111T of the etch stop layer 111 and a thickness 112T of the layer 112 may be substantially determined by the required etch stop capabilities, substantially without depending on the overall device geometry. In this case, the fraction of highly stressed dielectric material positioned in close proximity to the transistors 120 is substantially determined by the corresponding ratio of the thickness 110T on the one hand and the combined thickness 111T and 112T on the other hand.

FIG. 1d schematically illustrates the situation for a highly sophisticated semiconductor device in which the distance 124 may be reduced due to a scaling of the overall device dimensions and may be approximately 100 nm and even less. Since the thickness 111T and the thickness 112T may be substantially independent from the overall device dimensions, as previously explained, the thickness 110T of the stress-inducing layer 110 may have to be reduced over-proportionally in order to provide a required surface topography for the further processing of the device 100, such as, for example, providing the material 130 and patterning the same, as illustrated in FIG. 1a and described above. Consequently, the amount of material provided by the etch stop layers 111 and 112 may represent a moderately high fraction of the entire amount of material positioned in close proximity to the basic transistor structures 120, and hence the degree of performance gain based on the dual stress liner approach may be reduced with further device scaling.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to semiconductor devices and methods in which performance of highly scaled transistor devices may be enhanced by appropriately designing the contact structure of the devices in view of adjusting the stress transfer mechanism from a surrounding highly stressed dielectric material into the channel regions of the transistor devices. To this end, the size of contact elements formed in the dielectric material enclosing the gate electrode structures of the transistors may be adjusted, at least for one type of transistor, such that a desired strain component along the transistor width direction may be generated. Moreover, in some illustrative aspects disclosed herein, scalability of the strain-inducing mechanism may be enhanced by providing a dielectric material with one type of internal stress level, wherein a non-desired influence on other transistors may be significantly reduced by the appropriately designed contact element so that a non-desired strain component along the transistor length direction may be efficiently shielded, while nevertheless providing a performance enhancing strain component along the transistor width direction. For this purpose, the contact element may be formed to extend along a significant portion of the transistor width, while in other transistors, when a corresponding shielding effect may not be desired, conventional contact elements, for instance square-shaped contact elements, may be provided. Consequently, a high degree of flexibility in adjusting strain-inducing mechanism may be achieved while also providing enhanced scalability of process techniques since material of a single stress component may be deposited to enhance performance of one type of transistor, while performance enhancement of the other type of transistor may be adjusted on the basis of the contact elements of an appropriate elongated extension along the transistor width direction.

One illustrative semiconductor device disclosed herein comprises a transistor formed above a substrate and comprising a gate electrode structure that extends along a transistor width direction. Furthermore, the semiconductor device comprises an interlayer dielectric material formed around the gate electrode structure. Additionally, a contact trench is formed in the interlayer dielectric material and connects to at least one of a drain region and a source region of the transistor, wherein the contact trench comprises a conductive material and continuously extends along the transistor width direction.

One illustrative method disclosed herein comprises forming a stress-inducing dielectric material above a first transistor and a second transistor. The method further comprises forming a first contact opening in the stress-inducing dielectric material to connect to one of a drain region and a source region of the first transistor. Additionally, the method comprises forming a second contact opening in the stress-inducing dielectric material to connect to one of a drain region and a source region of the second transistor, wherein at least the first contact opening extends continuously along at least one half of a transistor width of the first transistor. Finally, the first and the second contact openings are filled with a metal-containing material.

A further illustrative method disclosed herein comprises depositing a stress-inducing layer above an N-channel transistor and a P-channel transistor, wherein the stress-inducing layer has a compressive internal stress level. Furthermore, a dielectric material is formed above the stress-inducing layer and a first contact opening connecting to one of a drain region and a source region of the N-channel transistor is formed, wherein the first contact opening extends along a transistor width direction with a first distance. The method further comprises forming a second contact opening connecting to one of a drain region and a source region of the P-channel transistor, wherein the second contact opening extends along a transistor width direction with a second distance that is less than the first distance. Finally, the first and second contact openings are filled with a metal-containing material.

BRIEF DESCRIPTION OF THE DRAWINGS

The disclosure may be understood by reference to the following description taken in conjunction with the accompanying drawings, in which like reference numerals identify like elements, and in which:

FIG. 1a schematically illustrates a cross-sectional view of a conventional semiconductor device including transistor elements of different conductivity type in densely packed device regions with respective stress-inducing dielectric layers formed in accordance with a conventional dual stress liner approach;

FIG. 1b schematically illustrates a top view of transistors of different conductivity type and corresponding stress conditions, which may allow performance enhancement of both types of transistors;

Figure 1C:
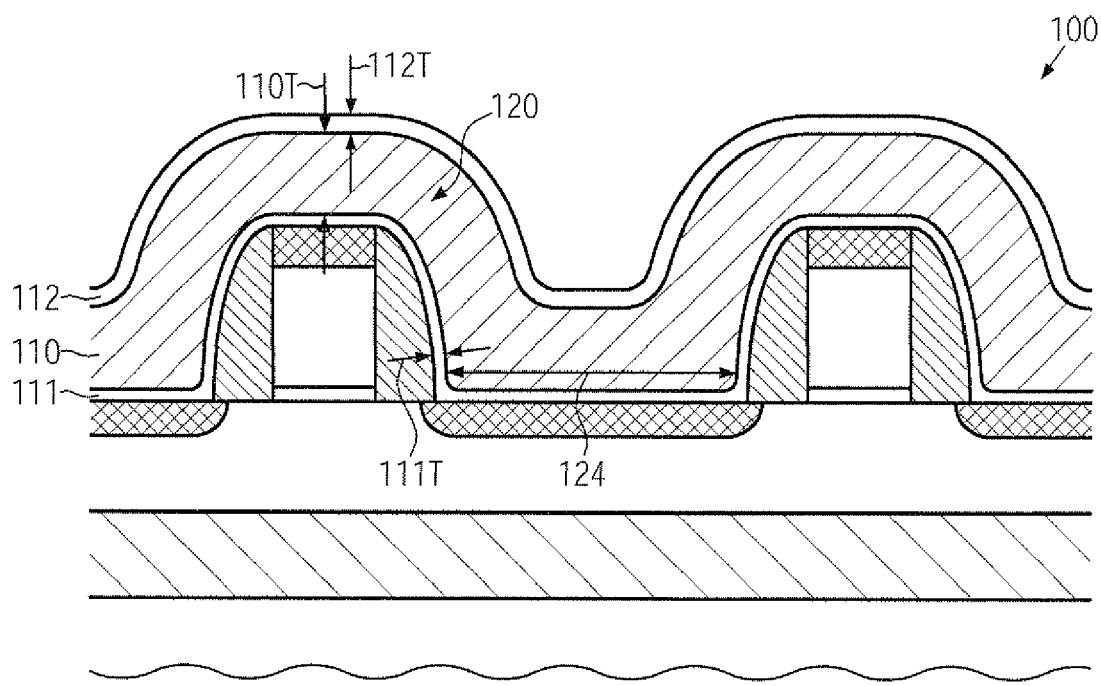
FIGS. 1c-1d schematically illustrate cross-sectional views of transistor elements in a densely packed device region with less critical overall device dimensions (FIG. 1c) and with a reduced distance between neighboring transistor elements (FIG. 1d), thereby illustrating the limitations of conventional dual stress liner regimes.
Figure 1D:
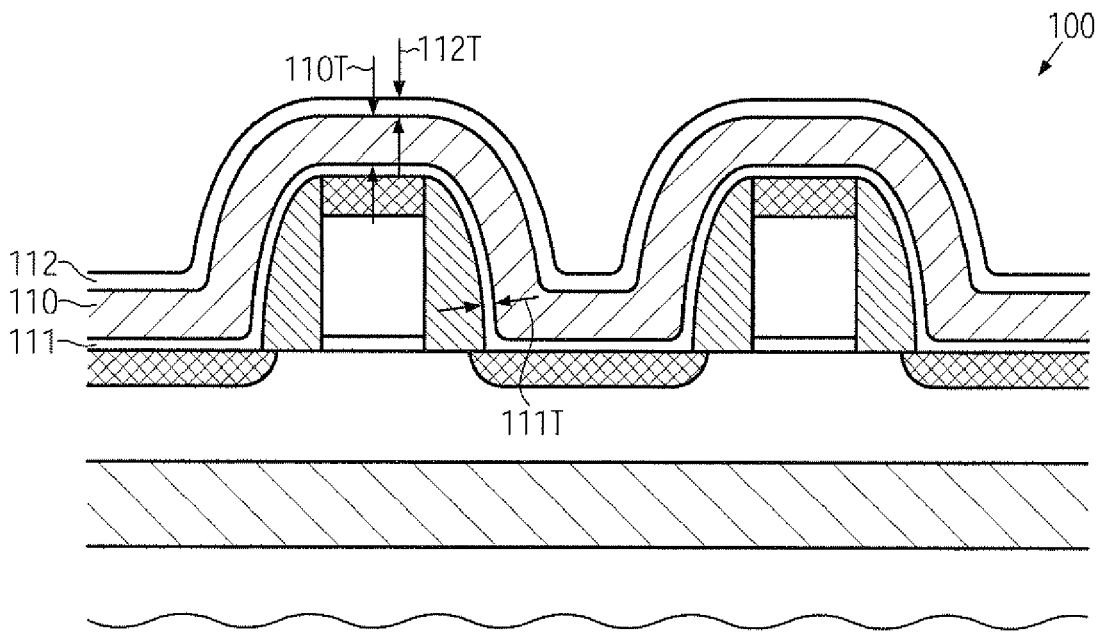

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to techniques and semiconductor devices in which enhanced scalability of strain-inducing mechanisms on the basis of highly stressed dielectric overlayers may be achieved by providing contact elements with a significant extension along the transistor width direction, at least for one type of transistor, wherein, in some illustrative embodiments disclosed herein, the contact elements of increased extension in the transistor width direction, which may also be referred to as trench contacts, may be filled with a tensile stressed metal-containing material. Hence, by providing contact elements of appropriately selected dimensions in the transistor width direction as well as in the transistor length direction, which corresponds to a "width" of the contact trenches, while also controlling the internal stress level of the contact material, an additional control mechanism may be provided on the basis of which an efficient control of transistor performance gain may be accomplished while using a stressed dielectric overlayer of a single type of internal stress level. For example, a dielectric material of high internal compressive stress level may be deposited on the basis of less critical deposition conditions in densely packed device regions since conventionally used etch stop layers may not be required, since the non-desired compressive stress may be efficiently compensated for, at least to a high degree, by providing respective contact trenches, for instance in combination with N-channel transistors, while, for P-channel transistors, well-established "standard" contact elements may be formed, which may thus enable an efficient stress transfer into the corresponding channel regions. In other illustrative embodiments, contact trenches may be formed for both types of transistors, possibly with a varying width of the corresponding contact trenches, to efficiently induce a strain component perpendicular to the transistor length direction in both types of transistors, while a stressed contact etch stop layer may provide a certain base stress component, which may be advantageous for one type of transistor. Furthermore, by providing contact trenches which may extend along the entire transistor width and which may also have a moderately great extension along the transistor length direction, a significant portion of a previously formed highly stressed interlayer dielectric material, such as a contact etch stop layer, may be replaced by the contact metal, which may be provided in the form of a stressed material, thereby enabling an efficient patterning of the overall stress conditions on the basis of the contact elements. Consequently, enhanced stress conditions may be obtained on the basis of a strain-inducing interlayer dielectric material, which may be formed to be in direct contact with the basic transistor structure and which may be deposited with an increased layer thickness compared to conventional dual stress liner regimes, while, on the other hand, the effect of an unwanted portion of the highly stressed dielectric material may be compensated or over-compensated for on the basis of the contact metal, which may be provided to extend along a significant portion of the transistor width direction, i.e., at least one half of the transistor width, and, in some illustrative embodiments, at least along the total transistor width, possibly in combination with an appropriately adapted "width" of the contact trench. Thus, in addition to enhanced scalability of the stress-inducing mechanism disclosed herein, a highly efficient overall process flow may be accomplished, since the adaptation of the stress conditions for the different types of transistors may be accomplished with significantly reduced complexity of the manufacturing flow. For example, in some illustrative embodiments, a process sequence may be used in which no additional lithography steps and etch steps may be required compared to the conventional dual stress liner approach, thereby enhancing yield and throughput during the production of highly sophisticated semiconductor devices. In other illustrative embodiments, an additional patterning process, for instance for selectively relaxing an internal stress level of a previously deposited highly stressed dielectric material, may be introduced, thereby only requiring one additional lithography step while avoiding any additional etch steps, which may thus also result in a significantly reduced process complexity compared to conventional dual stress liner regimes. For example, the stress relaxation may be performed on the basis of a lithography process and an ion implantation process, thereby still providing the advantages of reduced complexity of the deposition process for forming the highly stressed dielectric material, while enhancing the strain-inducing effect of the contact trenches that may be formed in the relaxed interlayer dielectric material.

Figure 2A:
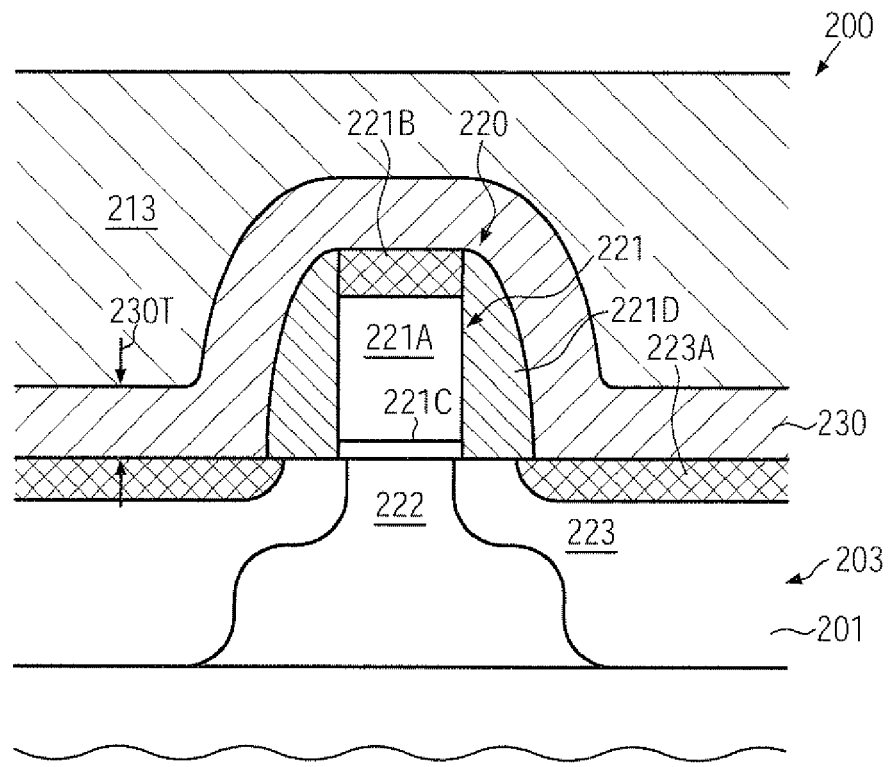
FIG. 2a schematically illustrates an advanced transistor element having a gate length of approximately 50 nm and less with an interlayer dielectric material including a stressed contact etch stop layer, according to illustrative embodiments.

FIG. 2a schematically illustrates a cross-sectional view of a semiconductor device 200 in an advanced manufacturing stage. As shown, the device 200 may comprise a substrate 201, such as a semiconductor substrate, an insulating substrate and the like, above which may be provided a semiconductor layer 203. For example, the semiconductor layer 203 may comprise a significant portion of silicon, possibly in combination with other components, such as germanium, carbon and the like, wherein the local charge carrier mobility in the semiconductor layer 203 may be enhanced by creating tensile or compressive strain therein, as previously explained. Furthermore, a buried insulating layer (not shown) may be provided, as is, for instance, also explained with reference to the device 100 when referring to the buried insulating layer 102. The substrate 201 and the semiconductor layer 203 may define a silicon-on-insulator (SOI) configuration, while, in the embodiment shown, a bulk configuration may be provided, in which the semiconductor layer 203 may represent an upper portion of a substantially crystalline substrate material. In still other illustrative embodiments, an SOI configuration and a bulk configuration may be provided in different device areas of the semiconductor device 200, depending on the overall device requirements. Furthermore, in the manufacturing stage shown, the semiconductor device 200 may comprise a transistor 220 in an advanced manufacturing stage. That is, the transistor 220 may comprise a gate electrode structure 221 including a gate electrode material 221A, for instance in the form of doped polysilicon material, possibly in combination with metal-containing silicide 221B, for instance in the form of a metal silicide. In other cases, the gate electrode material 221A may be provided in the form of a metal-containing material having an appropriate work function adapted to the overall transistor configuration of the device 220. Furthermore, the gate electrode structure 221 may comprise a gate insulation layer 221C, for instance in the form of "standard" dielectric materials, such as silicon dioxide, silicon oxynitride, silicon nitride and the like, while in other cases the gate insulation layer 221C may comprise a high-k dielectric material, which is to be understood as a dielectric material having a dielectric constant of 10 or higher. For instance, hafnium oxide, zirconium oxide and the like may be used in this case. The gate electrode structure 221 may also comprise a sidewall spacer structure 221D, depending on the overall process requirements. Furthermore, drain and source regions 223 may be formed in the semiconductor layer 203 and may laterally enclose a channel region 222 in which the charge carrier mobility may be modified by establishing desired strain conditions therein. The drain and source regions 223 may comprise highly conductive contact areas 223A, for instance in the form of a metal silicide. It should further be appreciated that, depending on the overall device and process requirements, the transistor 220 may also comprise additional strain-inducing mechanisms, such as appropriately selected semiconductor compounds or alloys, for instance in the form of silicon/germanium, silicon/germanium/tin, silicon/carbon and the like, which may be embedded at any appropriate location within the semiconductor layer 203 in order to induce a desired type of strain in the channel region 222. For example, a silicon/germanium alloy may frequently be embedded into the drain and source regions 223 to provide a compressive strain component in the channel region 222, when the transistor 220 represents a P-channel transistor. In other cases, a silicon/carbon mixture may be used in the drain and source regions 223 to induce a tensile strain in the channel region 222.

Furthermore, an interlayer dielectric material 213, for instance in the form of silicon dioxide and the like, may be formed above the basic transistor structure 220, wherein a highly stressed portion, indicated as layer 230, may also be provided, for instance in the form of a silicon nitride material, a nitrogen-containing silicon carbide material and the like, depending on the desired type of internal stress level.

The semiconductor device 200 as shown in FIG. 2a may be formed on the basis of the following processes. The transistor structure 220 may be formed by using well-established process techniques, possibly in combination with any strain-inducing mechanisms as may be required for enhancing overall performance of the transistor 220. For instance, similar process techniques may be used as previously explained with reference to the semiconductor device 100. The transistor 220 may represent an advanced transistor element having a gate length, i.e., in FIG. 2a the horizontal extension of the gate electrode material 221A, of 50 nm and less, which may result in a reduced distance between neighboring circuit elements, as will be described later on in more detail and is also explicitly discussed with reference to the semiconductor device 100. Hence, after completing the basic transistor structure, which may also involve the provision of sophisticated gate electrode structures in the form of metal-containing materials and high-k dielectrics, the stress-inducing dielectric material 230 may be deposited on the basis of well-established deposition techniques, as previously explained. Contrary to conventional strategies, however, an increased layer thickness may be used since the dielectric material 230 may be provided without requiring additional etch stop layers, as is the case in conventional dual stress liner approaches. Consequently, in some illustrative embodiments, the stressed dielectric material 230 may be directly deposited on the basic transistor structure 220, i.e., on the contact areas 223A. Moreover, depending on the general device geometry, a thickness 230T may be selected to respect the gap filling capabilities of the deposition technique under consideration, wherein, however, the resulting surface topography after the deposition of the layer 230 may not have to comply with a subsequent deposition of a further stressed dielectric material, thereby enabling the usage of a significantly increased design thickness for the layer 230 compared to a conventional device formed according to a dual stress liner approach for the same basic device configuration. In some illustrative embodiments, the dielectric material 230 may be provided as a highly compressively stressed material, for instance using silicon nitride or nitrogen-containing silicon carbide on the basis of appropriately selected process parameters. Thereafter, the interlayer dielectric material 213 may be deposited, for instance using well-established techniques, as is also previously described with reference to the device 100.

Figure 2B:
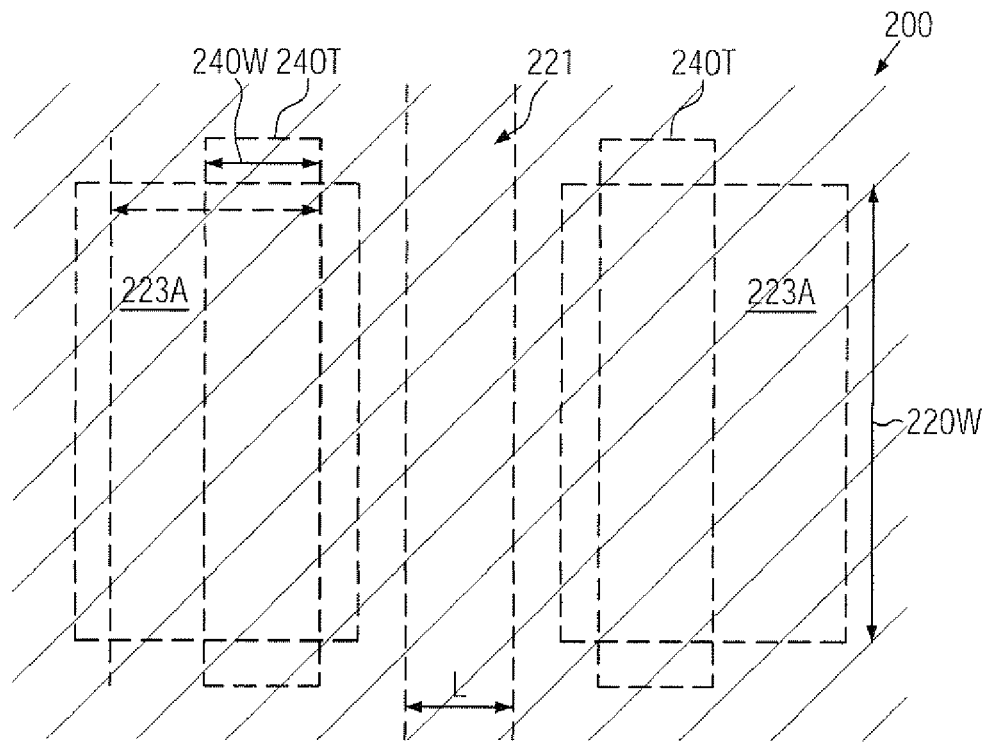
FIG. 2b schematically illustrates a top view of the transistor element in which the position of contact trenches is indicated according to illustrative embodiments, thereby providing enhanced design flexibility in adjusting the overall strain conditions in the channel region of the transistor.

FIG. 2b schematically illustrates a top view of the semiconductor device 200. As illustrated, the transistor 220 may have a transistor width 220W and may have a transistor length direction, indicated as L, which are determined by the overall design rules. Furthermore, the position of contact trenches 240T is indicated by the dashed lines, which are to be formed in the interlayer dielectric material 213 and the layer 230 (see FIG. 2a) in order to electrically contact the drain and source regions 223, i.e., the contact areas 223A. The dimensions of the contact trenches 240T may be selected such that a desired "patterning" of the overall stress conditions in the transistor 220 may be achieved. That is, the trenches 240T may extend a significant portion along the transistor width 220W, that is, the trenches 240T may continuously extend at least one half of the transistor width 220W and, in some illustrative embodiments as illustrated, may extend at least along the entire width 220W. In this manner, an efficient shielding of the effect of the highly stressed layer 230 (FIG. 2a) may be achieved, while, in other cases, depending on a lateral extension of the trenches 240T, as indicated by 240W, a significant amount of the highly stressed dielectric material of the layer 230 may be replaced by a contact metal, which may be provided on the basis of a desired internal stress level, such as a tensile stress, for which well-established deposition techniques are available for a plurality of metals, such as tungsten and the like. Thus, the trench width 240W may also be adjusted, as indicated by the arrows. It should be appreciated that the contact trenches 240T may not necessarily be provided as symmetric elements with respect to the gate electrode structure 221 but may, in some illustrative embodiments, be provided such that the dimension along the transistor width 220W and/or along the length direction L, i.e., the trench width 240W, may be selected differently at both sides of the gate electrode structure 221. For example, when two or more closely spaced transistors of the same conductivity type may be provided, the contact trenches 240T may continuously be provided between two adjacent transistor elements, thereby substantially completely removing any intermediate stress material of the layer 230.

Figure 2C:
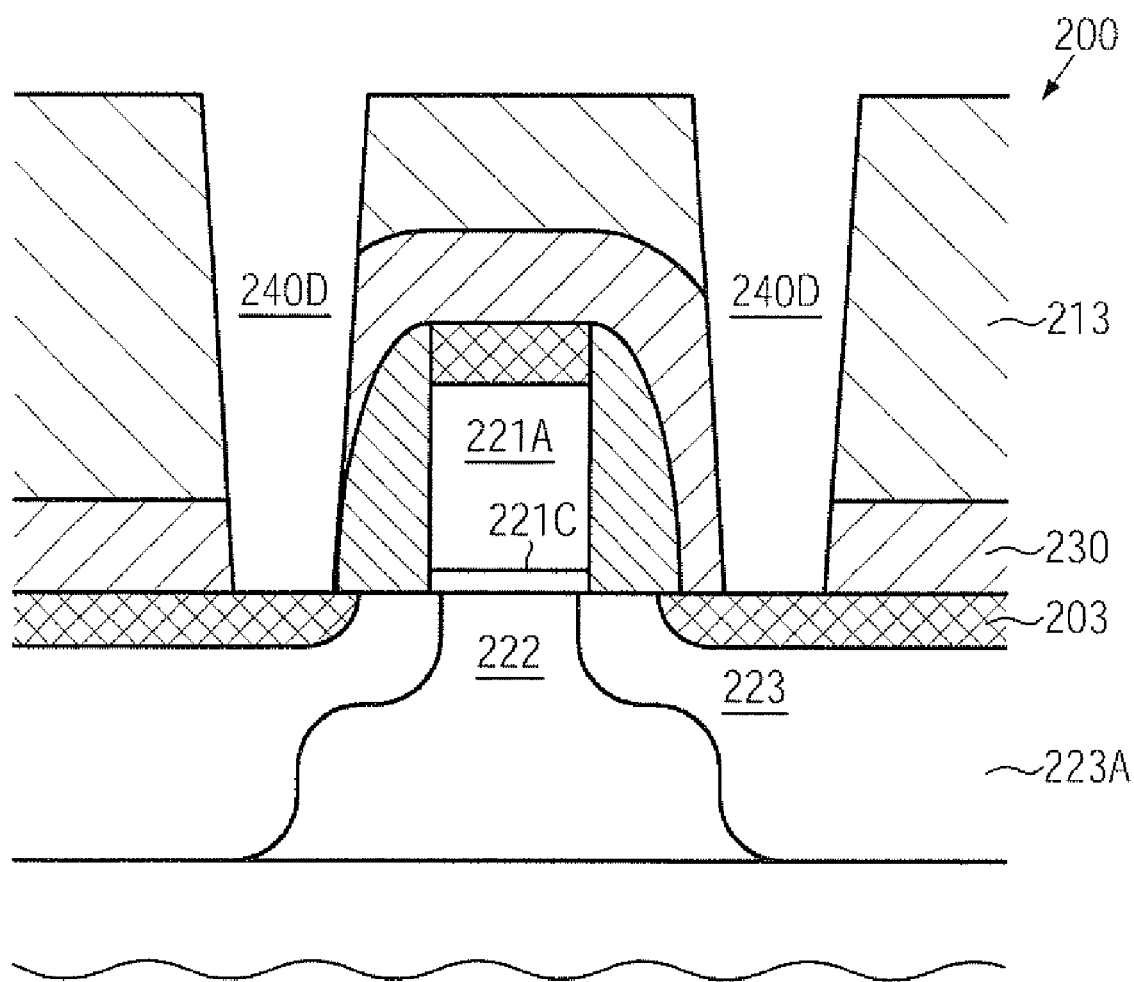
FIGS. 2c-2d schematically illustrate cross-sectional views of the transistor element during various manufacturing stages in forming the contact trenches, according to illustrative embodiments.

FIG. 2c schematically illustrates a cross-sectional view of the device 200 in an advanced manufacturing stage. As shown, trench openings 240D are formed in the interlayer dielectric material 213 and the stress-inducing layer 230, wherein the dimensions and the position of the trench openings 240D may correspond to the corresponding dimensions and locations as illustrated in FIG. 2b, except for process-induced variations. The openings 240D may be formed in accordance with appropriately designed photo masks on the basis of lithography and etch techniques, which may be based on conventional recipes to provide an appropriate mask layer (not shown), and etching the interlayer dielectric material 213. In this process, the layer 230 may be used as an efficient etch stop material, which may then be opened by well-established etch techniques in order to connect to the contact areas 223A. It should be appreciated that, in other device areas, differently sized contact openings may be formed, such as standard contact openings in the form of square-like openings and the like, when considered appropriate for adjusting the desired strain conditions.

Figure 2D:
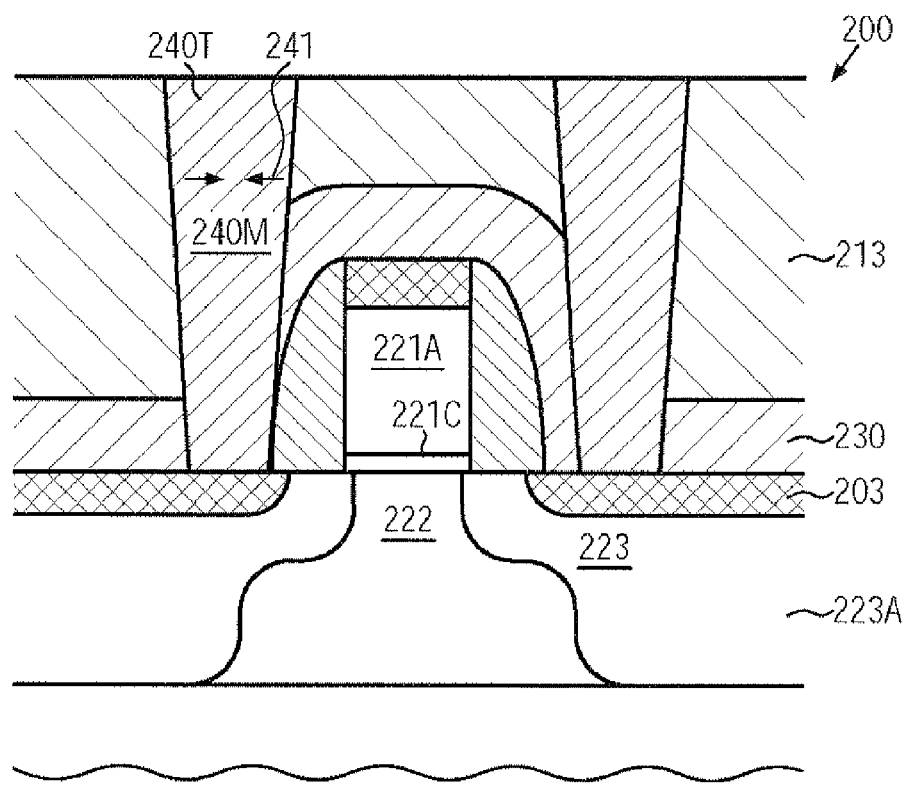

FIG. 2d schematically illustrates the semiconductor device 200 in a further advanced manufacturing stage. In this stage, a contact metal 240M may be filled into the openings 240D, thereby forming the contact trenches 240T. The metal 240M may represent any metal-containing conductive material, such as tungsten and the like, for which well-established deposition recipes are available, possibly in combination with a barrier material (not shown). For example, tungsten may be deposited by CVD so as to exhibit a moderately high tensile stress level, indicated as 241, in order to appropriately adjust the overall strain conditions in the channel region 222. In other cases, other appropriate materials may be used, such as copper, in combination with barrier materials and the like, wherein, also in this case, if desired, the internal stress level of the contact trench 240T may be adjusted in a more or less pronounced manner, depending on the material characteristics and the available deposition processes. For example, tungsten may be deposited on the basis of tungsten hexafluorine in a thermally activated CVD process in which process parameters, such as temperature, pressure, gas flow rates and the like, may be appropriately adjusted in order to obtain the desired tensile stress level.

Figure 2E:
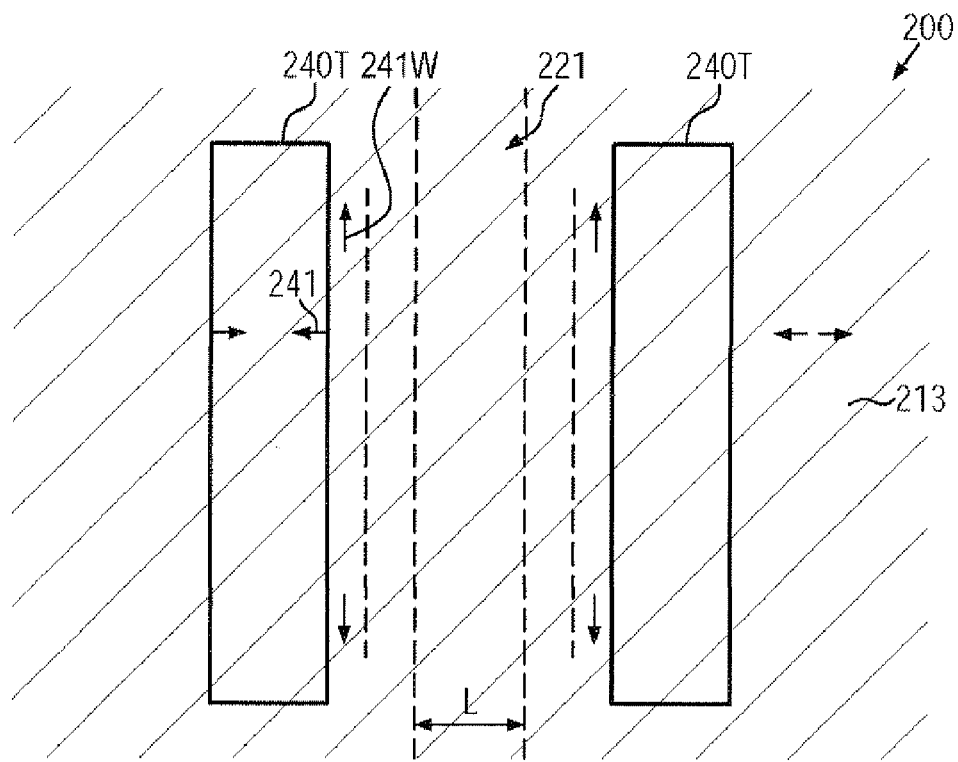
FIG. 2e schematically illustrates a top view of the transistor element and indicates the stress conditions on the basis of the contact trenches, according to illustrative embodiments.

FIG. 2e schematically illustrates a top view of the semiconductor device 200 as illustrated in FIG. 2d. As illustrated, a tensile stress level in the contact trenches 240T may efficiently reduce or shield a compressive stress level of the layer 230 (FIG. 2d), while at the same time providing a tensile stress component 241W along the transistor width direction. Hence, if the transistor 220 represents an N-channel transistor, a negative effect of a compressive stress of the layer 230, which may enhance performance of P-channel transistors (not shown) in other device regions, may be significantly reduced, while at the same time the performance enhancing stress component 241W may be created, thereby contributing to a performance gain of the transistor 220. As previously indicated, the dimensions of the contact trenches 240T may also be adjusted in order to obtain the desired overall performance gain for the transistor 220, depending on the internal stress level of the layer 230. For example, by increasing the dimensions of the trenches 240T, at least in the transistor length direction, a significant amount of the material of the layer 230 may be removed during the formation of the contact openings 240D (FIG. 2c) and may be replaced by the tensile stressed conductive material 240M (FIG. 2d). In other illustrative embodiments, the dimension of the trenches 240T in the transistor length direction may be selected moderately small when a significant shielding effect of the stress level of the layer 230 may not be desirable, for instance when the transistor 220 may represent a P-channel transistor, thereby still providing a significant influence of the stress of the layer 230 on the channel region 222, while at the same time the moderately high component 241W obtained by the longitudinal configuration of the trenches 240T may additionally induce a strain component for enhancing P-channel transistor performance, as is, for instance, explained with reference to FIG. 1b. Consequently, an efficient strain engineering may be accomplished on the basis of the dielectric layer 230, which may be provided with less critical deposition constraints and which may be deposited with increased thickness compared to conventional dual stress liner approaches, while also a respective patterning may be accomplished, at least for certain transistor types, by appropriately selecting a size of the contact trenches 240T and the internal stress level of the material 240M. For example, if required, a compressive stress level of the layer 230 may be efficiently shielded, while at the same time the stress component 241W may be exerted on the transistor 220, thereby providing a moderate enhancement of transistor performance for N-channel transistors, while, in P-channel transistors, a respective adaptation of the lateral dimensions may also enable an only moderate reduction of the stress component provided by the layer 230, while nevertheless obtaining a significant stress component in the transistor width direction in the form of the component 241W. It should be appreciated that, although the layer 230 has been described so as to exhibit a high compressive internal stress level, in other cases, a tensile stress level may be used in combination with the contact trenches 240T. For example, by providing the contact trenches 240T as "wide area" contact, a significant amount of the tensile stressed dielectric material may be removed within P-channel transistors, which may have implemented therein other effective strain-inducing mechanisms, such as embedded strained semiconductor alloys and the like, as previously explained, thereby enabling an efficient "strain relaxation" while, on the other hand, standard contact elements or also contact trenches 240T in the N-channel transistor may provide a high overall tensile strain component while also the component 241W may be induced if an elongated trench shape may be provided for the N-channel transistors.

Figure 2F:
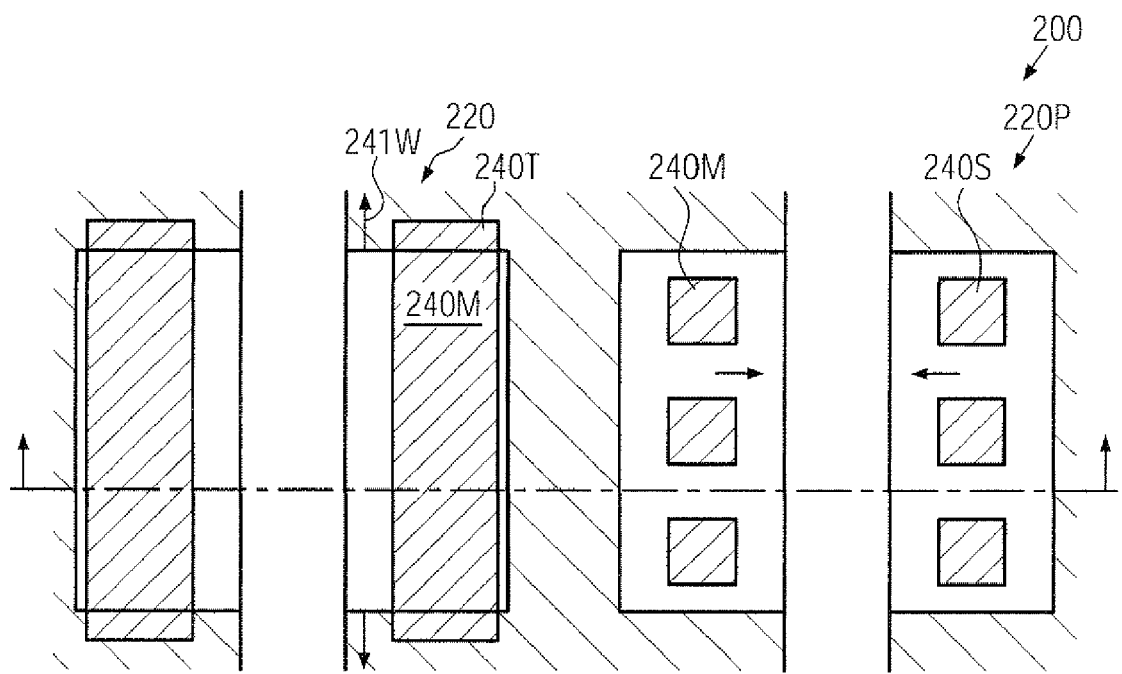
FIG. 2f schematically illustrates a top view of a semiconductor device including transistor elements having contact trenches and conventional contact elements in order to provide an efficient strain-inducing mechanism in combination with a stressed dielectric material, which may be formed above both transistor types, according to illustrative embodiments.

FIG. 2f schematically illustrates a top view of the semiconductor device 200 according to illustrative embodiments in which different types of contact elements may be used in combination with the stress-inducing layer 230 (FIG. 2d). As illustrated, in addition to the transistor 220, a further transistor 220P may be provided, which may be a transistor of different conductivity type compared to the transistor 220. In the embodiment shown, the transistor 220 may represent an N-channel transistor, while the transistor 220P may represent a P-channel transistor. Consequently, a high internal compressive stress level of the layer 230 (not shown in FIG. 2f) may provide a desired compressive strain component in the channel region of the transistor 220P, as previously explained, wherein, in the embodiment shown, contact to the element 240S may be provided, which may enable an efficient stress transfer into the channel region of the transistor 220P. That is, the contact elements 240S may be provided in the form of "standard" contact elements having a substantially square-like shape or any other appropriate shape which may reduce the "consumption" of material of the layer 230. On the other hand, the transistor 220 may comprise the trenches 240T having a significant shielding effect while also providing the stress component 241W, as explained above. It should be appreciated that, depending on the overall process and device requirements, the lateral dimensions of the trenches 240T may be adjusted in a manner as discussed above, for instance the lateral dimension in the transistor length direction may be increased in a more or less pronounced manner in order to remove material of the layer 230, if desired. Furthermore, the contact trenches 240T and the elements 240S may comprise the material 240M with a tensile stress level, as previously explained, wherein, however, the configuration of the contact elements 240S may be efficiently overcompensated for by the surrounding material of the layer 230 due to the contact elements provided in the form of small islands.

Figure 2G:
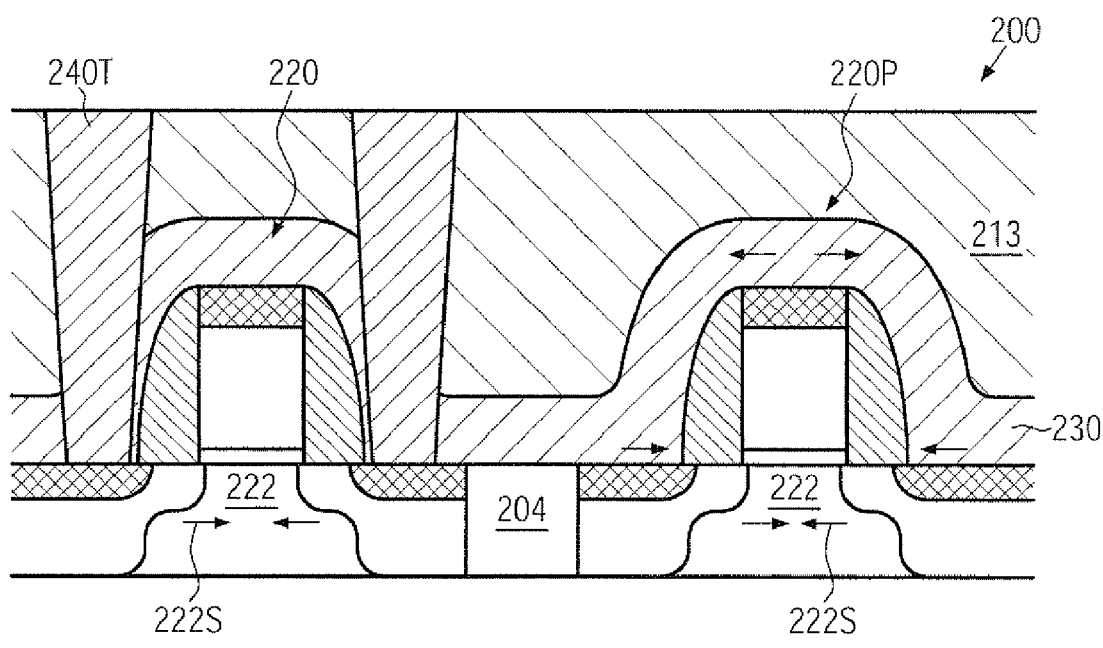
FIG. 2g schematically illustrates a cross-sectional view of the semiconductor device of FIG. 2f.

FIG. 2g schematically illustrates a cross-sectional view of the semiconductor device 200. In this embodiment, the device 200 may comprise an isolation structure 204 formed in the semiconductor layer so as to define transistor active areas for the transistor 220 and possibly additional transistors of the same conductivity type, if densely spaced device regions are considered, as is, for instance, explained with reference to FIG. 1a for the device region 150N. Similarly, the transistor 220P, possibly in combination with other transistors of the same conductivity type, may be provided, as is, for instance, explained with reference to the device region 150P in FIG. 1a. Furthermore, the contact trenches 240T may efficiently reduce the strain component induced by the layer 230, as indicated by 222S, while additionally the stress component 241W (FIG. 2f) may result in a corresponding strain component directed along the transistor width direction, thereby enhancing performance of the transistor 220, as previously explained. On the other hand, the transistor 220P may experience a high lateral strain component 222S due to the efficient stress transfer from the layer 230 into the channel region 222, which may be enabled on the basis of the standard contact element 240S (FIG. 2f).

In some illustrative embodiments, the internal stress level of the layer 230 may be patterned prior to forming the contact trenches 240T and the contact elements 240S, for instance by performing an ion implantation process after the deposition of the layer 230. For this purpose, an implantation mask may be provided by lithography to cover the transistor 220P while exposing the layer 230 formed above the transistor 220. Thereafter, an appropriate implantation species, such as silicon, germanium, xenon and the like, may be used for bombarding the exposed portion of the layer 230, thereby significantly relaxing an internal stress level. Thereafter, the further processing may be continued by removing the implantation mask and forming the interlayer dielectric material 213. Also in this case, a reduced process complexity compared to conventional dual stress liner approaches may be achieved in view of the two additional lithography processes, a deposition of etch stop materials, deposition of an additional stress-inducing material, respective etch processes for removing unwanted portions of the differently stressed dielectric materials. In still other illustrative embodiments, a corresponding selective stress relaxation may be performed after providing an initial layer portion of the material 230 in order to enhance the efficiency of the relaxation implantation and thereafter a further highly stressed material may be deposited which, however, may not significantly affect the transistor 220 due to the previously relaxed portion of the layer 230.

As a result, the principles disclosed herein provide methods and semiconductor devices in which enhanced scalability of a strain-inducing mechanism on the basis of a highly stressed dielectric overlayer may be achieved by providing a highly stressed dielectric material without additional etch stop layers, which may enable the provision of an increased amount of highly stressed dielectric material for sophisticated device geometries compared to conventional dual stress liner approaches. An efficient patterning of the strain induced by the highly stressed dielectric material may be accomplished by providing contact trenches, which may provide an additional strain component in the transistor width direction, which may be beneficial for N-channel transistors and P-channel transistors. In some illustrative embodiments, the contact trenches may be provided for one type of transistor, while, for another type of transistor, contact elements of standard size, such as square-shaped contact elements, may be used in order to maintain the desired high effect on the corresponding transistor element. In some illustrative embodiments, a single stressed overlayer may be used which may thus be provided with increased thickness compared to conventional approaches requiring etch stop layers. Hence, limiting the volume of the stress-inducing overlayer, as is the case in the dual stress liner approach, may not be necessary. Instead, a respective stress component may be appropriately patterned in the complementary transistor by using the contact trenches, thereby providing a high strain level in one type of transistor, such as P-channel transistors, due to the increased thickness of the stress-inducing layer, which may also be formed directly on the transistor structure, while an efficient shielding effect, possibly in combination with an additional strain component in the transistor width direction, may be obtained by the contact trenches. In other illustrative embodiments, a further patterning of the stressed dielectric overlayer may be performed prior to forming the contact trenches, for instance by using a relaxation implantation process.

In some illustrative embodiments, a significant reduced complexity of the overall process flow may be achieved compared to dual stress liner approaches, which typically require four deposition processes, two lithography steps, two etch steps, while a single deposition step without additional lithography and etch processes may be used according to the principles disclosed herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
   a first transistor having a first transistor width and a first transistor length and comprising a first gate electrode structure that extends along a first transistor width direction;
   a second transistor comprising a second gate electrode structure and having an opposite conductivity type of said first transistor;
   an interlayer dielectric material above said first and second transistors, wherein said interlayer dielectric material comprises a stressed dielectric layer around and above said first and second gate electrode structures, and said entire stressed dielectric layer has a first type of intrinsic stress of a substantially uniform first magnitude;
   a first contact trench positioned in said interlayer dielectric material and connecting to at least one of a drain region and a source region of said first transistor, wherein said first contact trench has a first trench length that continuously extends along said first transistor width direction and a first trench width that is substantially parallel to said first transistor length direction, said first contact trench comprising a stressed conductive material having a second type of intrinsic stress that is of an opposite type from said first type; and
   a second contact trench positioned in said interlayer dielectric material and connecting to at least the other one of said drain and said source region of said first transistor, wherein said second contact trench has a second trench length that continuously extends along said first transistor width direction and a second trench width that is substantially parallel to said first transistor length direction, wherein at least one of said second trench length and said second trench width is different than said first trench length and said first trench width, respectively, and wherein said second contact trench comprises said stressed conductive material.

2. The semiconductor device of claim 1, wherein at least one of said first and second contact trench lengths is at least the same as or greater than said first transistor width.

3. The semiconductor device of claim 1, wherein said second type of intrinsic stress is a tensile stress, and said stressed conductive material of said first and second contact trenches induces a tensile stress in a channel region of said first transistor along said first transistor width direction.

4. The semiconductor device of claim 1, wherein said first type of intrinsic stress is a compressive stress.

5. The semiconductor device of claim 4, wherein said first magnitude of said compressive stress is approximately 3 Giga Pascal or higher.

6. The semiconductor device of claim 1, further comprising a third contact trench positioned in said interlayer dielectric material and connecting to at least one of a drain region and a source region of said second transistor, wherein said second contact trench continuously extends along a second transistor width direction of said second transistor.

7. The semiconductor device of claim 1, wherein said first transistor is an N-channel transistor and said second transistor is a P-channel transistor.

8. The semiconductor device of claim 7, further comprising a plurality of contact elements in said interlayer dielectric material connecting to at least one of a drain region and a source region of said second transistor.

9. The semiconductor device of claim 8, wherein at least one of said first and second contact trench lengths is at least one-half of said first transistor width.

10. The semiconductor device of claim 1, wherein said stressed dielectric layer is on a metal silicide region of drain and source regions of said first and second transistors.

11. The semiconductor device of claim 1, wherein said stressed dielectric layer is comprised of silicon nitride.

12. The semiconductor device of claim 1, wherein said stressed dielectric layer is comprised of nitrogen-containing silicon carbide.

13. The semiconductor device of claim 1, wherein substantially the entirety of at least one of said first and second contact trenches is made of said stressed conductive material.

14. A semiconductor device, comprising:
an N-channel transistor comprising a first gate electrode structure that extends along a width direction of said N-channel transistor;
a P-channel transistor comprising a second gate electrode structure;
an interlayer dielectric material above said N-channel and said P-channel transistors, wherein said interlayer dielectric material comprises a stressed dielectric layer around and above said first and second gate electrode structures, and said entire stressed dielectric layer having a compressive internal stress level of a substantially uniform first magnitude;
a first contact trench positioned in said interlayer dielectric material and connecting to at least one of a drain region and a source region of said N-channel transistor, wherein said first contact trench has a first trench length that continuously extends along said width direction and a first trench width that is substantially parallel to a length direction of said N-channel transistor, said contact trench comprising a stressed metal-containing conductive material having an internal tensile stress level;
a second contact trench positioned in said interlayer dielectric material and connecting to at least the other one of said drain and said source region of said N-channel transistor, wherein said second contact trench has a second trench length that continuously extends along said width direction and a second trench width that is substantially parallel to said length direction, wherein at least one of said second trench length and said second trench width is different than said first trench length and said first trench width, respectively, wherein said second contact trench comprises said stressed metal-containing conductive material, and wherein said stressed metal-containing conductive material of said first and second contact trenches induces a tensile stress in a channel region of said N-channel transistor along said width direction; and
at least one contact element in said interlayer dielectric material connecting to at least one of a drain region and a source region of said P-channel transistor.

15. The semiconductor device of claim 14, wherein substantially the entirety of at least one of said first and second contact trenches is made of said stressed metal-containing conductive material.

16. The semiconductor device of claim 14, wherein at least one of said first and second contact trench lengths is at least one-half of a width of said N-channel transistor.

17. The semiconductor device of claim 14, wherein at least one of said first and second contact trench lengths is at least the same as or greater than said width of said N-channel transistor.

18. The semiconductor device of claim 14, wherein at least one of said first trench length and said second trench length is greater than said first trench width and said second trench width, respectively.

19. The semiconductor device of claim 1, wherein the entirety of at least one of said first and second contact trenches is made of said stressed metal-containing conductive material.

20. The semiconductor device of claim 1, further comprising a barrier material layer positioned between at least one of said first and second contact trenches and said interlayer dielectric material.

21. A semiconductor device, comprising:
a transistor formed in and above a substrate, said transistor having a transistor width, a transistor length, and a gate electrode structure that extends along said transistor width direction;
a stress-inducing interlayer dielectric material formed around and above said gate electrode structure, said stress-inducing interlayer dielectric material having a first type of intrinsic stress; and
a first contact trench positioned in said interlayer dielectric material and connecting to at least one of a drain region and a source region of said transistor, wherein said first contact trench has a first trench length that continuously extends along said transistor width direction and a first trench width that is substantially parallel to said transistor length direction, said first contact trench comprising a stressed conductive material having a second type of intrinsic stress that is of an opposite type from said first type; and
a second contact trench positioned in said interlayer dielectric material and connecting to at least the other one of said drain and said source region of said transistor, wherein said second contact trench has a second trench length that continuously extends along said width direction and a second trench width that is substantially parallel to said transistor length direction, wherein at least one of said second trench length and said second trench width is different than said first trench length and said first trench width, respectively, wherein at least one of said first and second contact trench lengths is at least one-half of said transistor width, and wherein said second contract trench comprises said stressed conductive material.

22. The semiconductor device of claim 21, wherein substantially the entirety of at least one of said first and second contact trenches is made of said stressed conductive material.

* * * * *